(12) United States Patent
Chen et al.

(10) Patent No.: US 7,667,972 B2
(45) Date of Patent: Feb. 23, 2010

(54) CONNECTOR WITH A HEAT SINK

(75) Inventors: Wu-Hsiung Chen, Taipei (TW); Wen-Ta Chiu, Taipei (TW)

(73) Assignee: Chant Sincere Co., Ltd., Taipei Hsien (TW)

( * ) Notice: Subject to any disclaimer, the term of this patent is extended or adjusted under 35 U.S.C. 154(b) by 262 days.

(21) Appl. No.: 11/798,269

(22) Filed: May 11, 2007

(65) Prior Publication Data

US 2008/0278914 A1 Nov. 13, 2008

(51) Int. Cl.
*H05K 7/20* (2006.01)
*H01R 12/18* (2006.01)

(52) U.S. Cl. ............... 361/709; 361/704; 361/715; 165/80.3; 165/104.33; 165/185; 439/159; 439/485; 439/487

(58) Field of Classification Search ......... 361/686–689, 361/704–712, 715, 719; 165/80.3, 104.33, 165/185; 257/706, 707, 712, 713, 718–727; 174/15.1, 16.1, 16.3, 252; 439/159, 266, 439/382, 485, 487

See application file for complete search history.

(56) References Cited

U.S. PATENT DOCUMENTS 6,942,506 B2 * 9/2005 Kimura et al. ............ 439/159
7,090,519 B2 * 8/2006 Muramatsu et al. ......... 439/159
7,133,285 B2 * 11/2006 Nishimura ................ 361/715

FOREIGN PATENT DOCUMENTS

| JP | 2005222437 A | * | 8/2005 |
| JP | 2005242946 A | * | 9/2005 |
| JP | 2007026854 A | * | 2/2007 |
| JP | 2007080580 A | * | 3/2007 |
| KR | 2007047562 A | * | 5/2007 |

* cited by examiner

Primary Examiner—Michael V Datskovskiy

(57) ABSTRACT

A connector with a heat sink to prevented a card from being damaged due to friction when the card is inserted or removed includes a frame provided with two guide arms and two elastic members, each guide arm containing two chutes, each chute containing an upper and a lower limit zones; a pressurizing-down mechanism connected to the frame, a leading post received in the chute being disposed on each side arm, and a heat sink being provided on top; card insertion driving the pressurizing-down mechanism to move with its leading post in the chute for the heat sink to contact the card to conduct the heat generated from the card; and the elastic member moving the pressurizing-down mechanism into the upper limit zone to remove the card.

8 Claims, 15 Drawing Sheets

CONNECTOR WITH A HEAT SINK

FIELD OF THE INVENTION

The present invention is related to a connector, and more particularly to one that is provided with a heat sink.

BACKGROUND OF THE INVENTION

According to Mole's Law applied in the manufacturing process of semiconductor, more and more electronic components tend to be made smaller in size thanks to advanced development of technology. With reduced size, waste heat generated by power consumed in the transition of signals becomes critical to the service life of those electronic components. Generally, the higher the temperature rises, the service life of an electronic device gets shorter. How to equip the electronic device with a perfect heat sink to dissipate heat before demanding faster transmission speed on the electronic device is extremely important. Without effective heat dissipation, the electronic device fails to execute long-time operation and prevents reliable operation of the entire system.

As illustrated in FIG. 1 of the accompanying drawings, a card connector taught in Taiwan Patent No. M279910 achieves the purpose of heat dissipation by connecting a heat sink to a card. Wherein, the connector 1 includes a heat sink 2; the heat sinks contacts one side of a card C inserted into a connecting portion 3; and an elastic device 4 to drive the heat sink 2 to advance to the side of the card C. A pressurizing-down rod 5 contains a cam portion 6. The heat sink 2 operates on a first cam surface 7 when the card C is inserted; and operates on a second cam surface 8 when the card C is ejected. This functioning mechanism is provided in conjunction with a PCMCIA card. When the PCMCIA card in inserted, the heat sink 2 lays flushed on a surface of the PCMCIA card. However, the cam portion 6 is only single sided; and the PCMCIA become vulnerable to be damaged since friction takes place between the heat sink 2 surface of the PCMCIA card each time the PCMCIA card inserted into the connector 1. Therefore, the poor design of the prior art prevents effective expansion of its application aspect.

SUMMARY OF THE INVENTION

The primary purpose of the present invention is to provide a connector containing a heat sink. By having a leading post from a pressurizing-down mechanism movably incorporated with a chute with elevation fall, the present invention allows a PCMCIA card to be fully inserted into the connector before the heat sink pressurizing-down to lay flushed on a surface of the PCMCIA card to effectively protect the PCMCIA card by avoiding friction between the heat sink and the PCMCIA card whenever the PCMCIA card is inserted into or ejected from the connector.

To achieve the purpose, the present invention includes a frame, two guide arms are respectively disposed on both sides of the frame, two chutes are disposed on each guide arm, and the chute contains an upper limit zone and a lower limit zone; a pressurizing-down mechanism fixed to the frame through those guide arms, a leading post is disposed to each of both side arms of the pressurizing-down mechanism and received in the chute, the leading post is restricted in the upper limit zone when the pressurizing-down mechanism moves forward and in the lower limit zone when the pressurizing-down mechanism moves backward; and a heat sink fixed to the pressurizing-down mechanism, the heat sink is connected to a card through a heat conduction medium, the heat sink on the pressurizing-down mechanism is driven to connect a surface of the card when the card is fully inserted into the connector to conduct heat produced by the card through the heat sink while preventing the card from being damaged by friction in the source of insertion.

BRIEF DESCRIPTION OF THE DRAWINGS

FIG. 4A is a side view showing an operating status of a preferred embodiment of the present invention before a card is pushed in.

FIG. 5A is a side view showing another operating status of a preferred embodiment of the present invention after a card is pushed in.

DETAILED DESCRIPTION OF THE PREFERRED EMBODIMENTS

Figure 1:
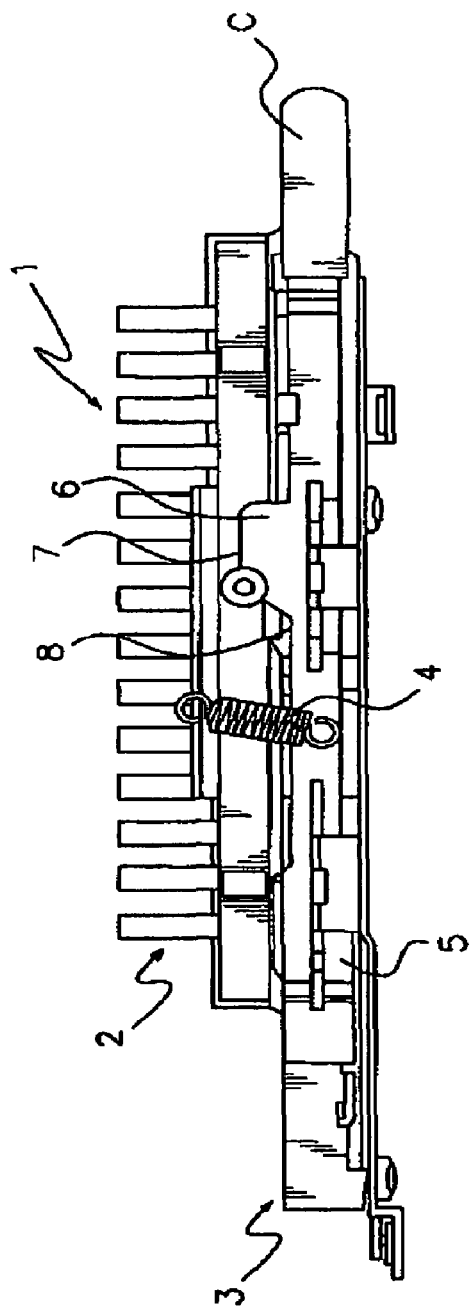
FIG. 1 is a schematic view of the prior art.
Figure 2:
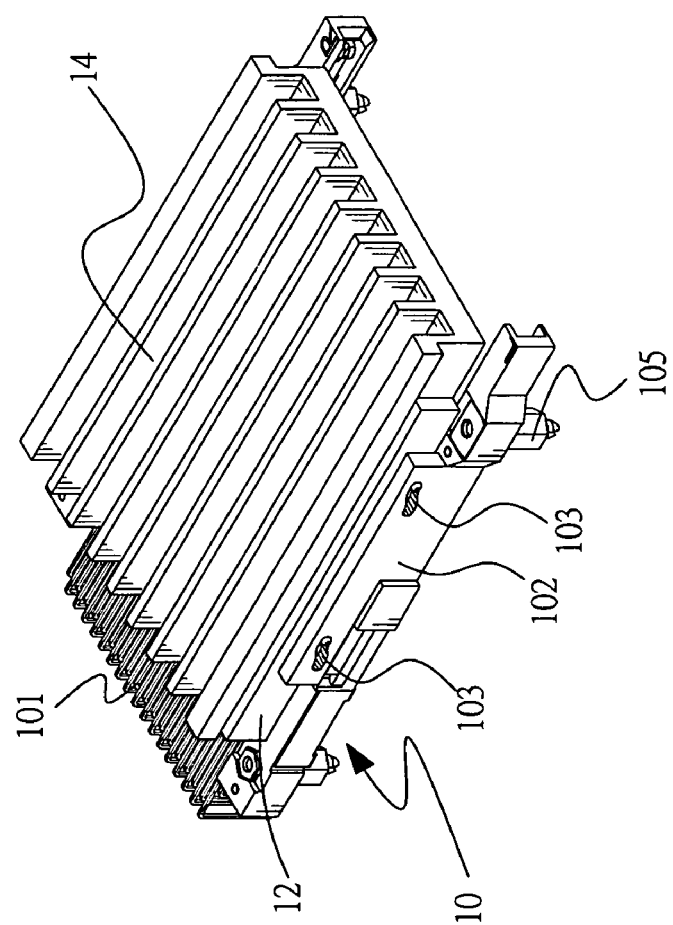
FIG. 2 is a perspective view of a connector provided with a heat sink of the present invention.
Figure 3:
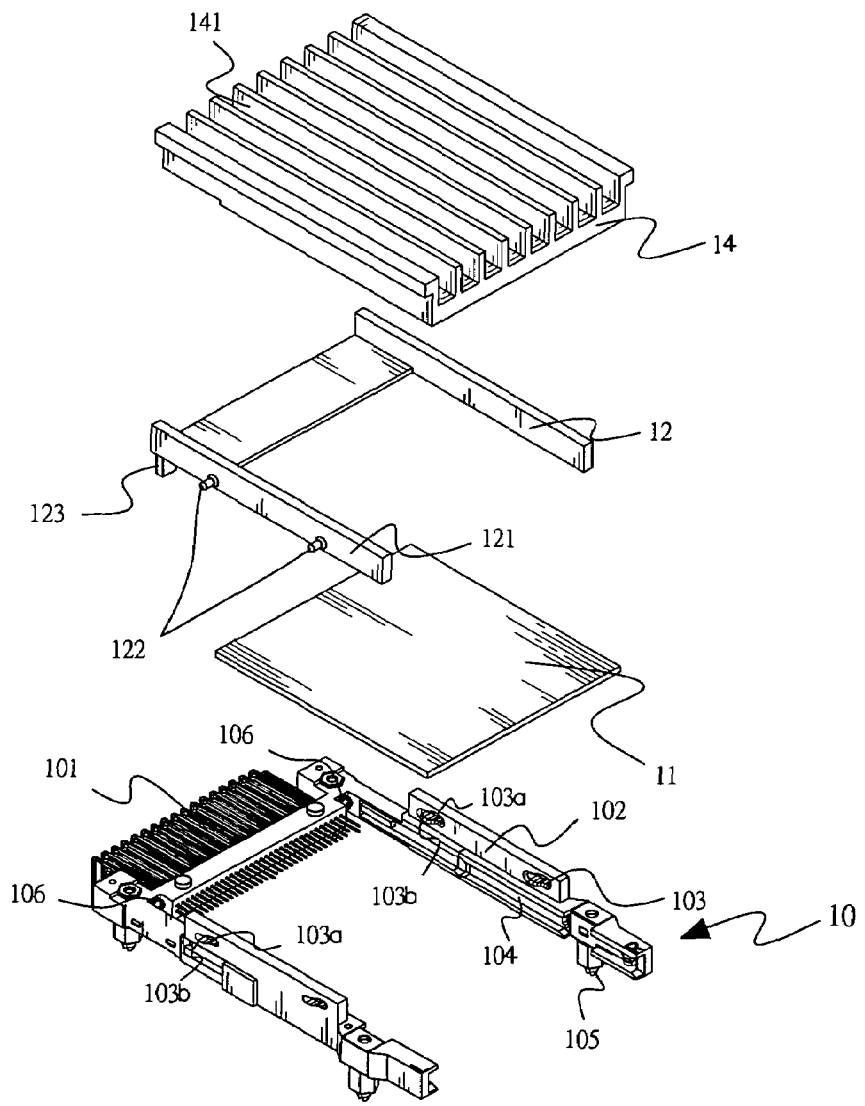
FIG. 3 is an exploded view of the connector provided with a heat sink of the present invention.
Figure 3A:
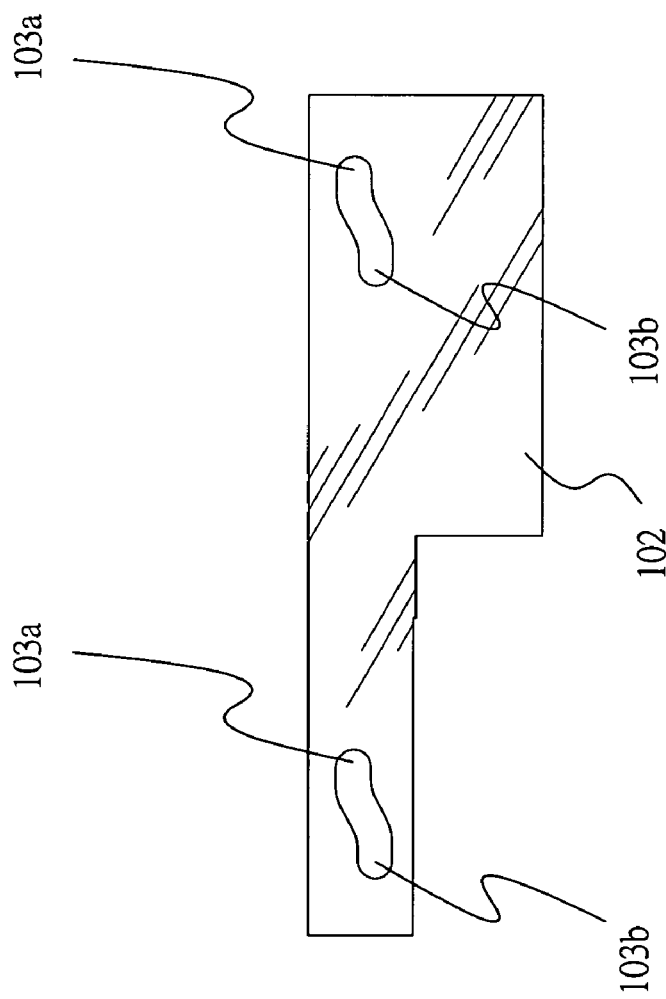
FIG. 3A is a magnified view of a cutaway of a chute in the present invention.

Referring to FIGS. 2, 3, and 3A, a preferred embodiment of the present invention includes a frame 10, a pressurizing-down mechanism 12, a heat sink 14, and a heat conduction medium 11. The frame 10 is related to a PCMCIA card connector; a line of multiple electric pins 101 are provided to the rear end of the frame 10 to electrically connect to the card; two guide arms 102 are respectively disposed on both sides of the frame 10; two chutes 103 are provide on each guide arm 102 with each chute 103 containing an upper limit zone 103a and a lower limit zone 103b; a slide 104 is disposed on the inner side of the frame 10 to facilitate insertion of the card; an elastic member 106 is disposed to the rear end of the slide 104 to return the pressurizing down mechanism 12 to its home; and multiple screws 105 are provided to the perimeter of the frame 10 to secure the frame 10 to a circuit substrate.

The pressurizing-down mechanism 12 is movably connected to the frame 10 through both guide arms 102; the heat sink 14 comprised of multiple longitudinally or laterally arranged fins 141 is fixed to the pressurizing-down mechanism 12; a leading post 122 to be received in the chute 103 is disposed to each side arm 121 of the pressurizing-down mechanism 12; and a driving block 123 is disposed to the rear end of the pressurizing-down mechanism 12 and in front of the elastic member 106 located on the inner side of the rear end of the frame 10.

The heat conduction medium 11 disposed on the bottom of the heat sink 14 is made of a buffer material, e.g., graphite, heat conduction silicon film or fiberglass to conduct the heat from the card to the heat sink 14 for dissipation. Whereas both of the heat sink 14 and the card are made of hard material, the use of the heat conduction medium 11 improves the close attachment between the heat sink 14 and the card on one hand and prevents excessive friction between the heat sink 14 and the card when connected on the other hand.

Figure 4A:
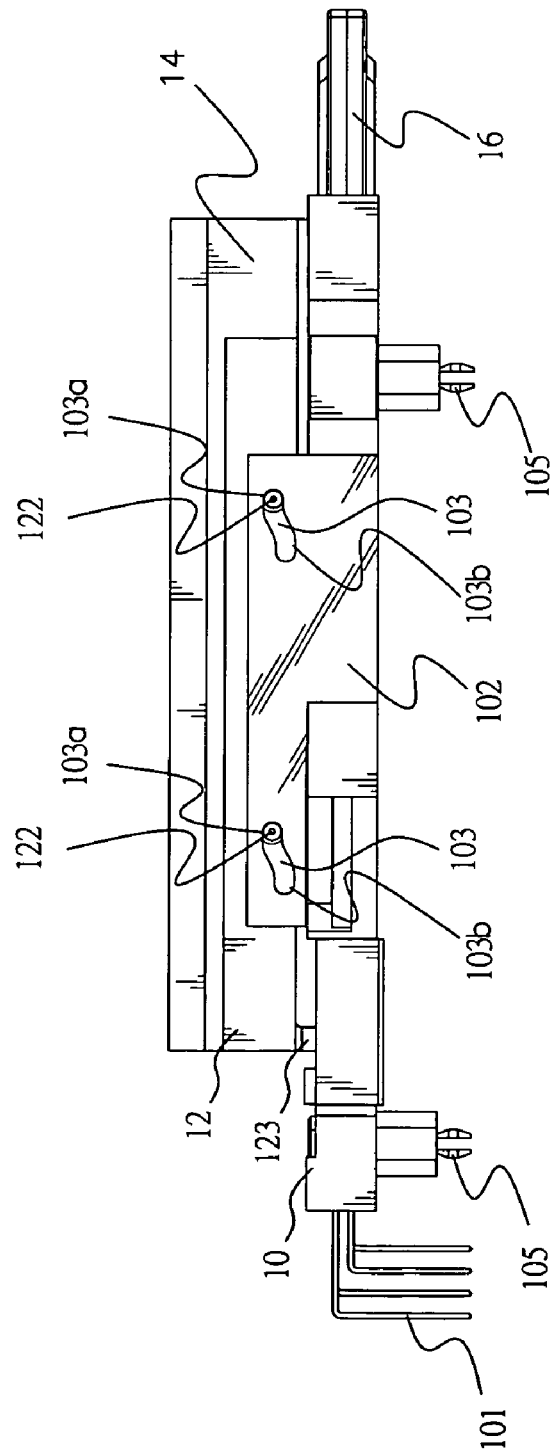
Figure 4B:
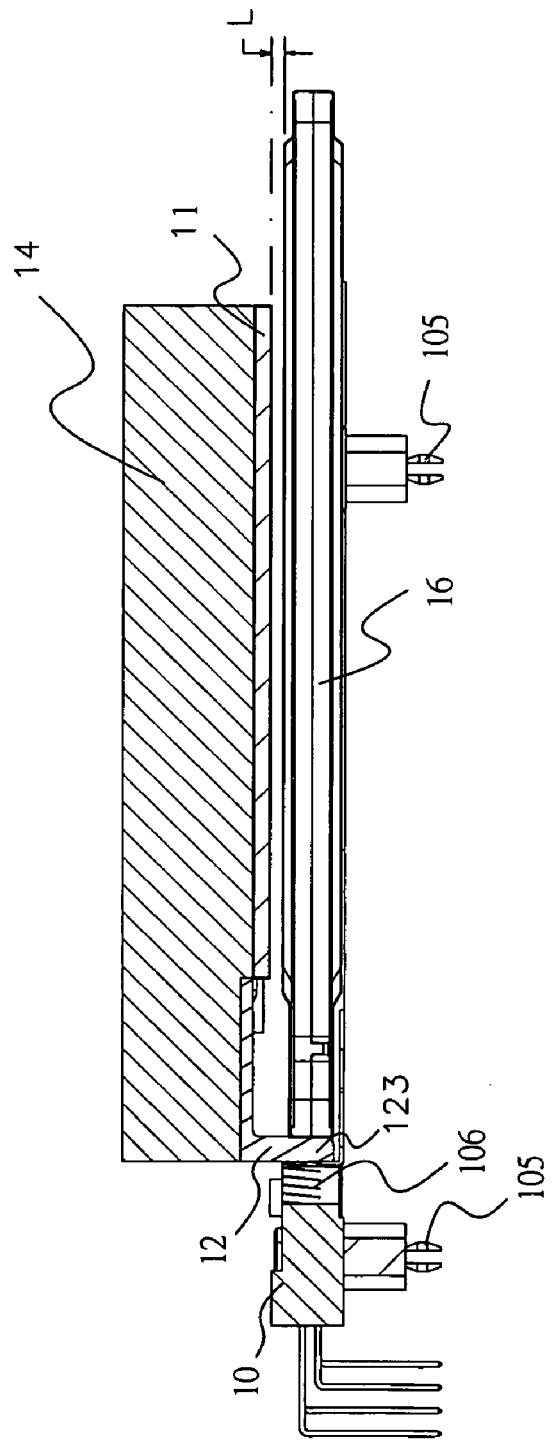
FIG. 4B is a sectional view of the preferred embodiment of the present invention as illustrated in FIG. 4A.
Figure 5A:
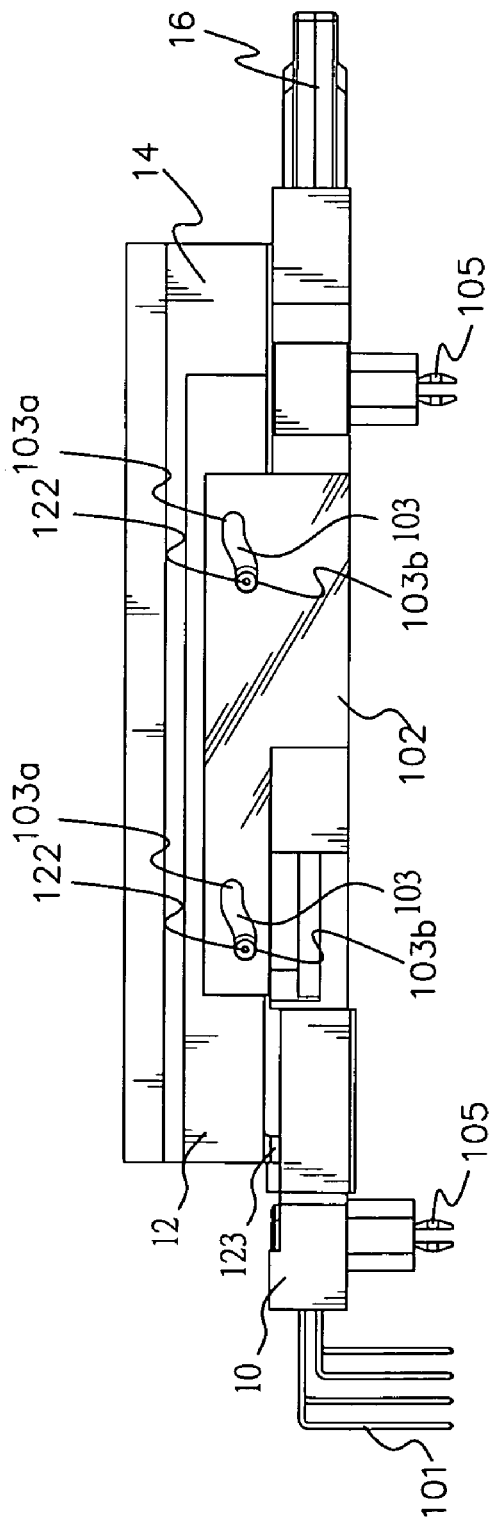
Figure 5B:
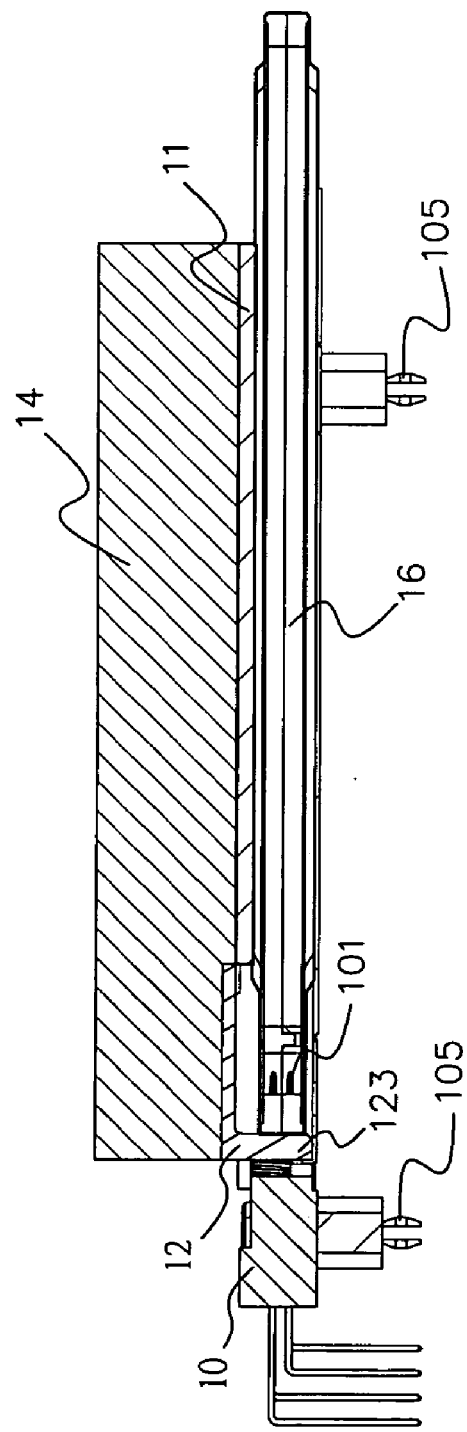
FIG. 5B is a sectional view of the preferred embodiment of the present invention as illustrated in FIG. 5A.
Figure 6:
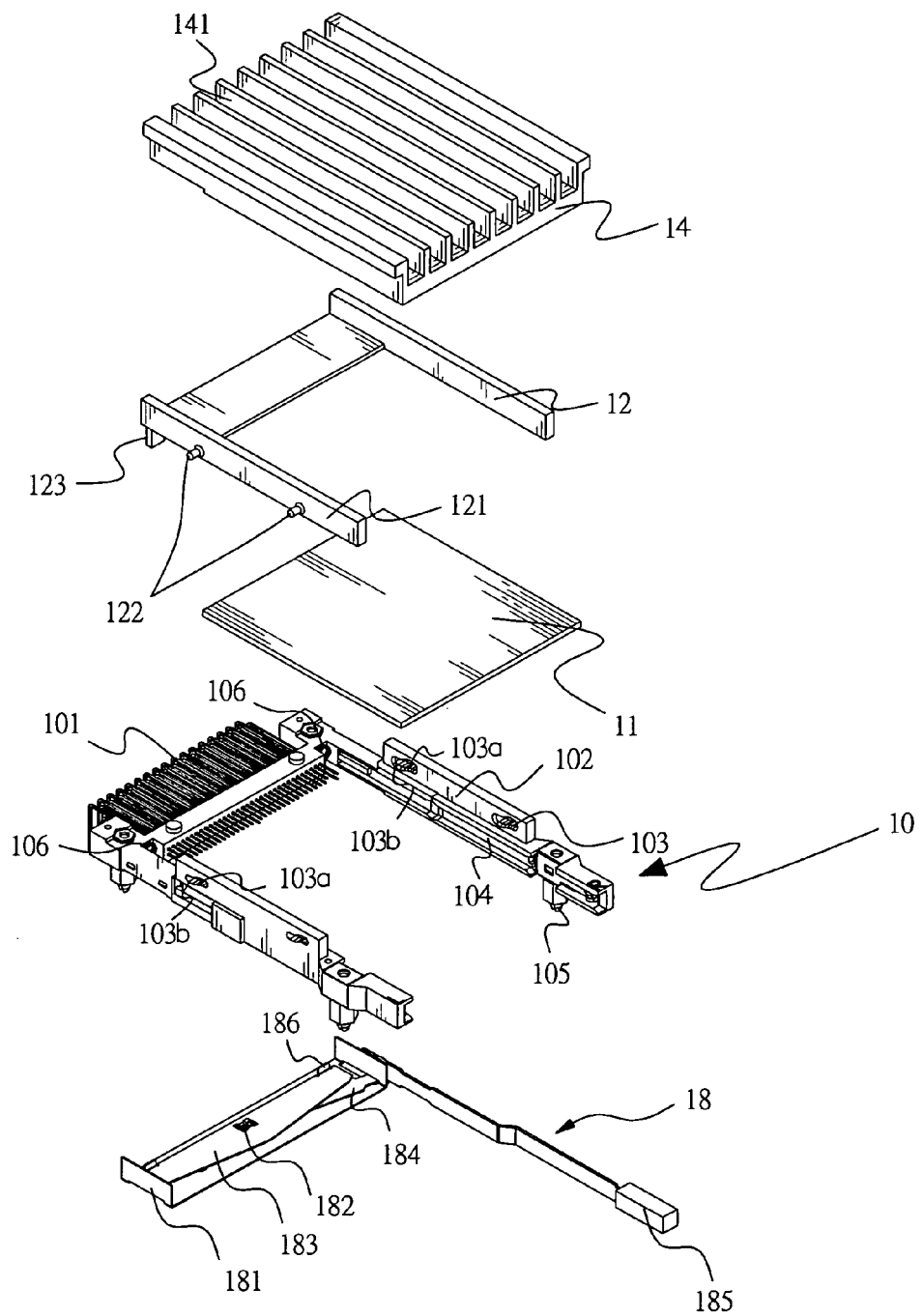
FIG. 6 is a perspective view of an additional card ejection mechanism to the present invention.
Figure 7A:
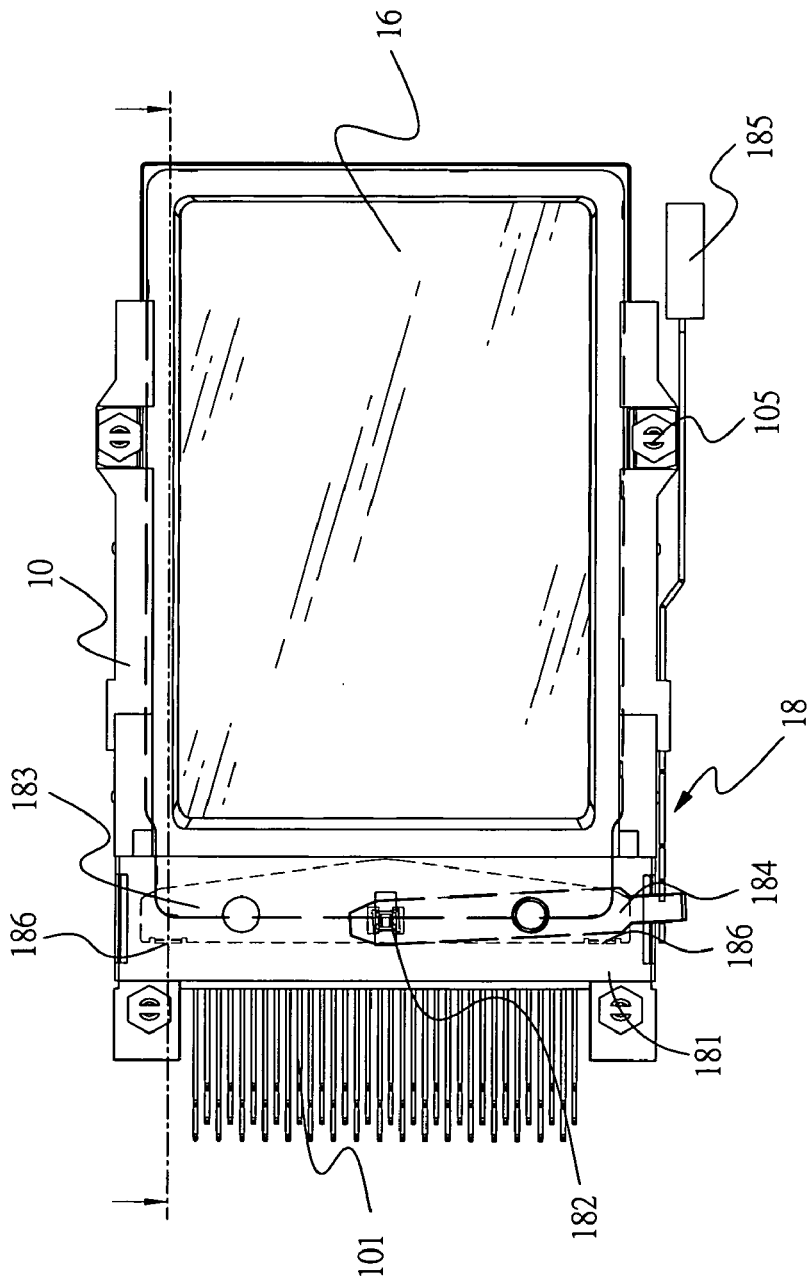
FIG. 7A is an upward view showing another preferred embodiment of the present invention before a card is pushed into the card ejection mechanism.
Figure 7B:
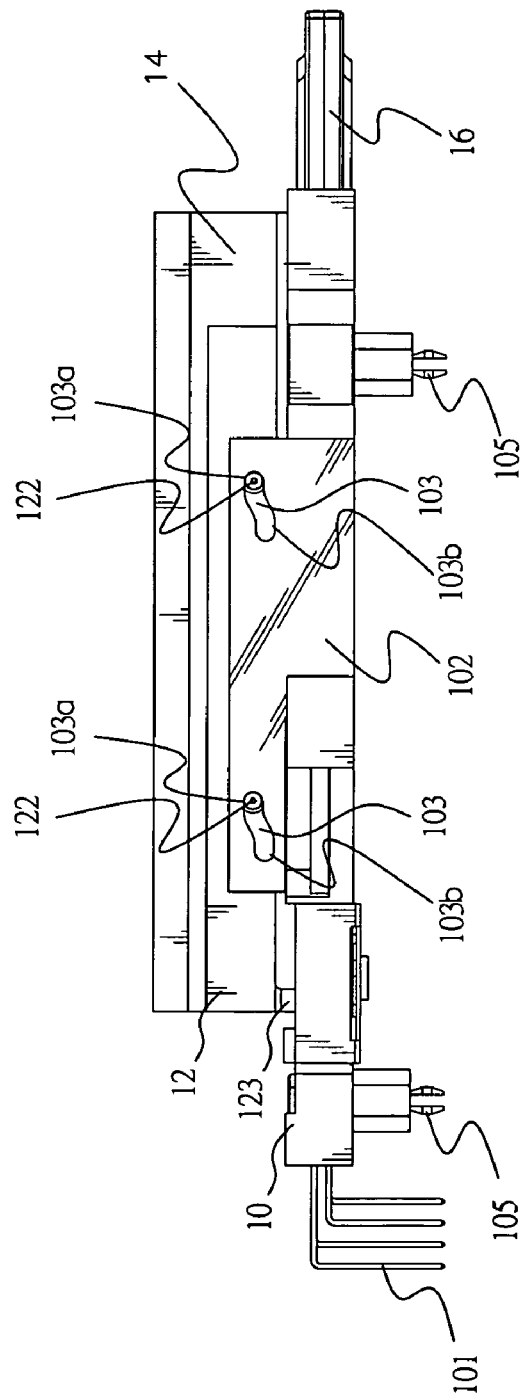
FIG. 7B is a side view showing the operating status of another preferred embodiment of the present invention before the card is pushed into the card ejection mechanism.
Figure 7C:
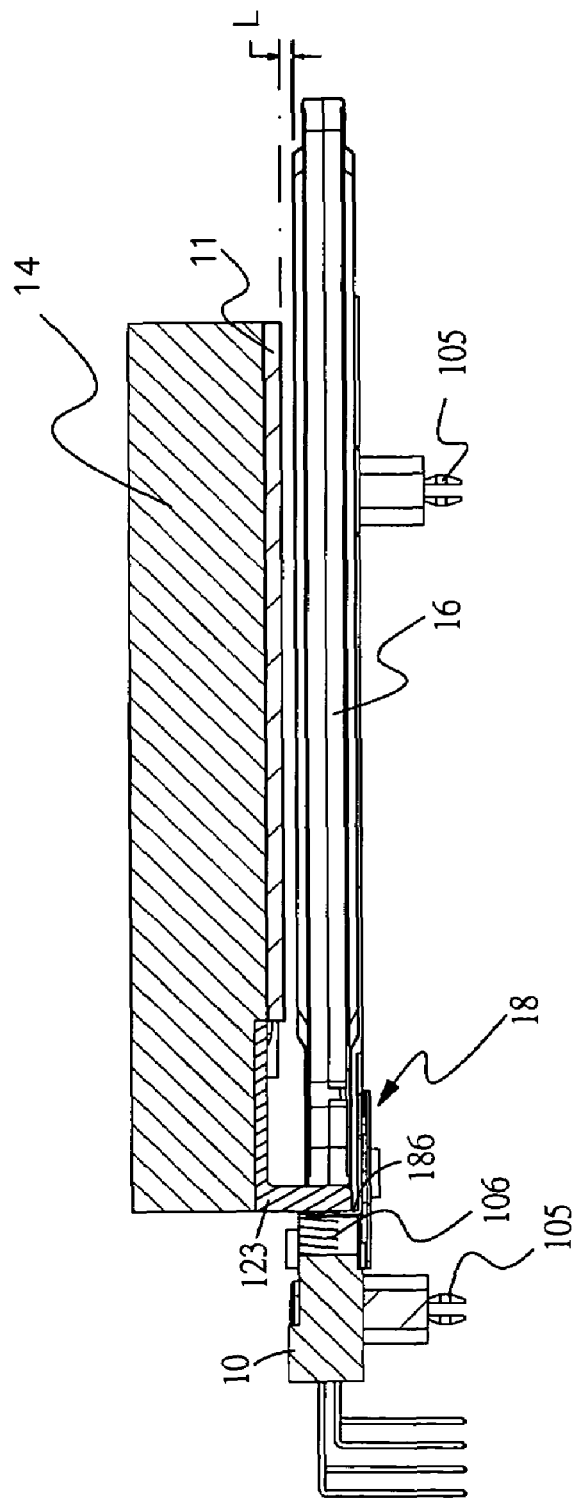
FIG. 7C is a sectional view of another preferred embodiment of the present invention as illustrated in FIG. 7A.

As illustrated in FIGS. 4A and 4B, when the card 16 is not yet inserted to the end, both elastic members 106 provided to both rear ends of the frame 10 push against the driving block 123 for each leading post 122 of the pressurizing-down mechanism 12 to be restricted in the upper limit zone 103$a$ to define an elevation fall L between the heat conduction medium 11 below the heat sink 14 and the card 16 so to facilitate insertion of the card 16. When the card 16 is inserted to approach the end of the slide 104, it contacts the driving block 123 in the frame 10 to further drive the pressurizing-down mechanism 12 for each leading post 122 to gradually move down and back along the chute 103. Finally the heat conduction medium 11 contacts an upper surface of the card as illustrated in FIGS. 5A and 5B to conduct the heat through the heat sink 14. Upon removing the card 16, the elastic member 106 forces the pressurizing-down mechanism 12 and the heat sink 14 to gradually move up and forward to return to the upper limit zone 103$a$ thus to clear away from the card 16. While the card 16 is moving, it will not contact the heat sink 14 and the conduction medium 11 disposed at the bottom of the heat sink 14 thus to prevent the card 16 from being damaged by friction.

Figure 8A:
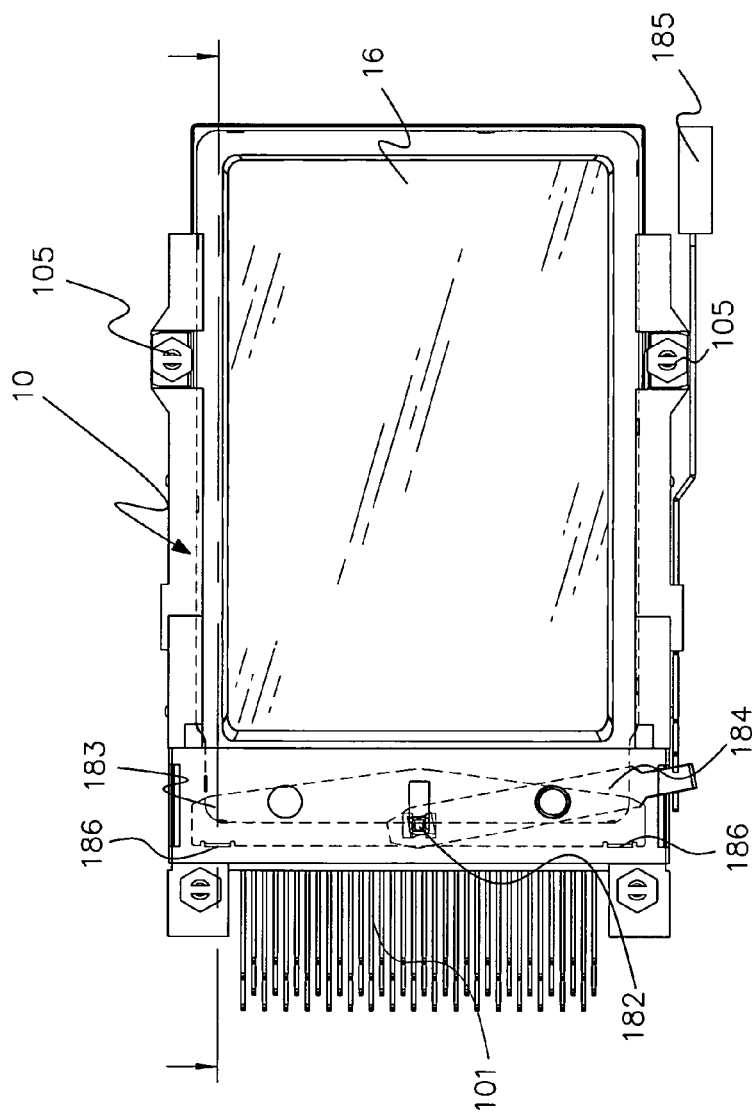
FIG. 8A is an upward view showing another preferred embodiment of the present invention after the card is pushed into the card ejection mechanism.
Figure 8B:
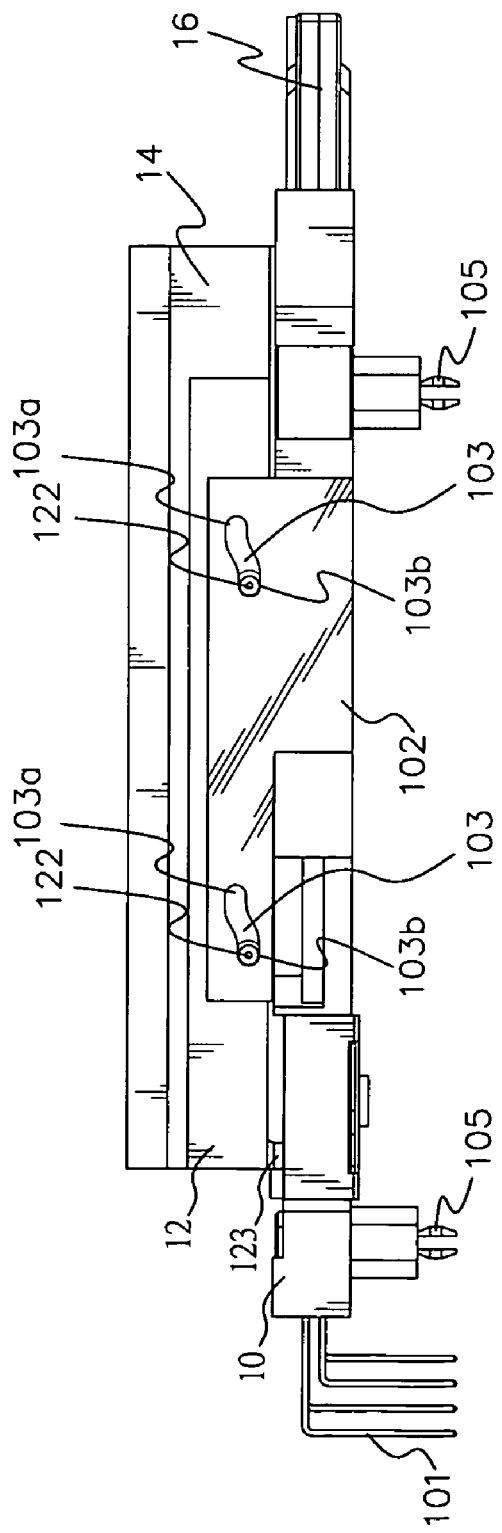
FIG. 8B is a side view showing another preferred embodiment of the present invention after the card is pushed into the card ejection mechanism.
Figure 8C:
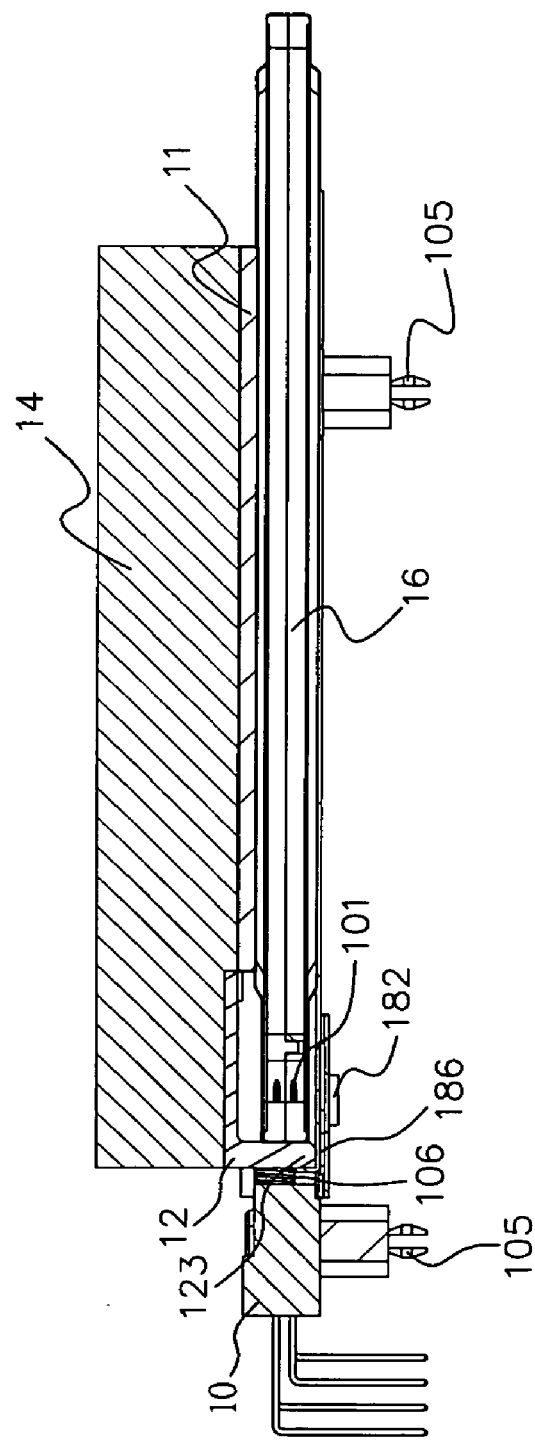
FIG. 8C is a sectional view of another preferred embodiment of the present invention as illustrated in FIG. 8A.

Now referring to FIGS. 6, 7A, 7B, and 7C, another preferred embodiment of the present invention further includes a card ejection mechanism 18. The card ejection mechanism 18 disposed on the bottom of the frame 10 includes a base frame 181 provided with an axis 182 connected to and drive a linking plate 183 and a connection rod 184. An extrusion linkage 185 is connected to the connection rod 184, and a retainer 186 behind the linking plate 183 is disposed either in front of or behind the driving block 123. Once the card 16 is first inserted before pushing the driving block 123 of the pressurizing-down mechanism 12, each leading post 122 of the pressurizing-down mechanism 12 is located in the upper limit zone 103$a$ of the chute 103 to define a certain range L between the surface of the card 16 and the heat conduction medium 11 at the bottom of the heat sink 14 so to prevent contacting and rubbing against the card 16. As illustrated in FIGS. 8A, 8B, and 8C, the driving block 123 is pushed as the card 16 moves deeper to drive the pressurizing-down mechanism 12 to gradually move back and down into the lower limit zone 103$b$ with its leading post 122 moving along the chute 103. Finally, when the card 16 is electrically connected to those electric pins 101, the heat conduction medium 11 closely contacts the card 16 for the card 16 to dissipate heat.

Upon removing the card 16, the extrusion linkage 185 is pushed back for the connection rod 184 to apply force to move the linking plate 183 and the retainer 186 to forward, thus to eject the card 16 out of the frame 10. The elastic member 106 returns to its home while pushing back the pressurizing-down mechanism 12. The pressurizing-down mechanism 12 after the card 16 is ejected gradually moves up and forward to return to its home in the upper limit zone 103$a$ on the chute 103. With the absence of the card, both elastic members 106 located at the rear ends of the frame 10 push against the driving block 123 for each leading post 122 of the pressurizing-down mechanism 12 to be restricted in the upper limit zone 103$a$ to define an elevation fall to facilitate insertion of the card 16. Without contacting the heat sink 14 in the course insertion or ejection, the card 16 is prevented from damaged due to friction.

Of course, the present invention is also applicable to any other card connectors including a CF card connector.

The prevent invention provides an improved structure of a connector with a heat sink, and the application for a utility patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

What is claimed is:

1. A connector with a heat sink includes a frame provided at its rear multiple electric pins, a pair of guide arms respectively disposed on both sides of the frame, two chutes being disposed on each guide arm, the chute containing an upper and a lower limit zones, and an elastic member being disposed to each guide arm of the frame; a pressurizing-down mechanism movably connected to the frame through both guide arms, two leading posts each received in the chute being respectively provided on both side arms of the pressurizing-down mechanism, and a driving block being provided to the rear of the pressurizing-down mechanism; and a heat sink fixed to the pressurizing-down mechanism.

2. The connector with a heat sink as claimed in claim 1, wherein the elastic member is disposed on the inner side at the rear end of the frame, the diving block is disposed in front of the elastic member; and each leading post of the pressurizing-down mechanism is restricted in the upper limit zone before the card is inserted.

3. The connector with a heat sink as claimed in claim 1, wherein a card ejection mechanism is further provided to the frame.

4. The connector with a heat sink as claimed in claim 3, wherein the card ejection mechanism includes a bottom frame; an axis being disposed on the bottom frame to connect a linking plate, a connection rod; an extrusion linkage being connected to the connection rod; and a pair of retainers being further disposed on the linking plate.

5. The connector with a heat sink as claimed in claim 4, wherein the retainer is disposed behind the driving block.

6. The connector with a heat sink as claimed in claim 4, wherein the retainer is disposed in front of the driving block.

7. The connector with a heat sink as claimed in claim 1 or 3, wherein a heat conductor medium is disposed on the bottom of the heat sink and is made of graphite, heat conduction silicon film or fiberglass.

8. The connector with a heat sink as claimed in claim 1, wherein the frame relates to a PCMCIA card connector or a CF card connector.

* * * * *